United States Patent
Mont et al.

(10) Patent No.: US 9,947,547 B2
(45) Date of Patent: Apr. 17, 2018

(54) ENVIRONMENTALLY GREEN PROCESS AND COMPOSITION FOR COBALT WET ETCH

(71) Applicants: International Business Machines Corporation, Armonk, NY (US); LAM RESEARCH CORPORATION, Fremont, CA (US)

(72) Inventors: Frank W. Mont, Troy, NY (US); Cornelius Brown Peethala, Albany, NY (US); Shariq Siddiqui, Albany, NY (US); Randolph F. Knarr, Voorheesville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/196,526

(22) Filed: Jun. 29, 2016

(65) Prior Publication Data

US 2018/0005839 A1 Jan. 4, 2018

(51) Int. Cl.
*H01L 21/44* (2006.01)
*H01L 21/306* (2006.01)
*H01L 21/285* (2006.01)
*H01L 21/768* (2006.01)

(52) U.S. Cl.
CPC ...... *H01L 21/30604* (2013.01); *H01L 21/285* (2013.01); *H01L 21/76883* (2013.01)

(58) Field of Classification Search
CPC .......... H01L 21/30604; H01L 21/285
USPC ........................................ 438/595
See application file for complete search history.

(56) References Cited

U.S. PATENT DOCUMENTS

| 679,343 | A | | 7/1901 | Singer |
| 5,908,509 | A | | 6/1999 | Olesen et al. |
| 6,149,828 | A | * | 11/2000 | Vaartstra .......... C23F 1/10 216/57 |
| 6,167,891 | B1 | | 1/2001 | Kudelka et al. |
| 6,558,477 | B1 | | 5/2003 | Scovell |
| 6,875,705 | B2 | | 4/2005 | Tsai et al. |
| 7,527,986 | B1 | | 5/2009 | Jung |
| 8,585,917 | B2 | * | 11/2013 | Lee .......... H01L 21/02101 134/1 |
| 2007/0293054 | A1 | * | 12/2007 | Lee .......... H01L 21/02101 438/743 |
| 2013/0028828 | A1 | * | 1/2013 | Lujano .......... C01D 7/00 423/422 |

(Continued)

FOREIGN PATENT DOCUMENTS

| KR | 1020070087707 A | 8/2007 |
| KR | 100771535 B1 | 10/2007 |

OTHER PUBLICATIONS

Ong, Michaelina et al., "Cobalt Stripping Process Integration for Cobalt Salicide Residue Improvement," ICSE (IEEE) 2008 Proc; pp. 609-613.

*Primary Examiner* — Caleb Henry
(74) *Attorney, Agent, or Firm* — Cantor Colburn LLP; Vazken Alexanian

(57) ABSTRACT

An environmentally green wet etch process for selective removal of cobalt metal generally includes applying water that is free of added buffers, acids, and/or bases to a substrate including exposed cobalt metal. The process can be utilized to form recesses where desired such as may be implemented for metal contact fill, metal gate fill, interconnect fill, or the like.

19 Claims, 5 Drawing Sheets

(56) References Cited

U.S. PATENT DOCUMENTS

2013/0098391 A1* 4/2013 Hoffmann ............... C23G 1/14
 134/2
2013/0098392 A1* 4/2013 Hoffmann ............... C23G 3/00
 134/2
2015/0140812 A1 5/2015 Zope et al.
2015/0179501 A1* 6/2015 Jhaveri ............ H01L 21/76224
 257/506

* cited by examiner

US 9,947,547 B2

ENVIRONMENTALLY GREEN PROCESS AND COMPOSITION FOR COBALT WET ETCH

BACKGROUND

The present invention relates to methods of semiconductor fabrication. More particularly, the present invention relates to wet etching methods that selectively remove cobalt.

Integrated circuit processing can be generally divided into front end of the line (FEOL), middle of the line (MOL) and back end of the line (BEOL) processes. The FEOL and MOL processing will generally form many layers of logical and functional devices. By way of example, the typical FEOL processes include wafer preparation, isolation, well formation, gate patterning, spacer, extension and source/drain implantation, silicide formation, and dual stress liner formation. The MOL is mainly gate contact (CA) formation. Layers of interconnections are formed above these logical and functional layers during the BEOL processing to complete the integrated circuit structure. As such, BEOL processing generally involves the formation of insulators and conductive wiring.

Cobalt is a promising fill material that can be used in FEOL, MOL, and BEOL manufacture of advanced semiconductor devices, for example, as a PMOS fill material in a metal gate, a contact conductor fill, and as a conductor fill material for interconnects. Conventional methods of etching cobalt in these processes generally include wet etching with corrosive and toxic materials or dry etching using plasmas that produce undesirable byproducts, have poor selectivity to other films/materials exposed, or ineffective etch rates.

SUMMARY

Disclosed herein are methods of selectively etching a cobalt metal layer. In one embodiment, a method of selectively etching a cobalt layer, includes applying water to selectively remove at least a portion of the cobalt from the cobalt layer, wherein the water is at a pH of 4 to 10 and is free of added buffer, acid, and/or base other than absorbed gases from an ambient environment.

In another embodiment, a method of forming a semiconductor structure includes forming a cobalt metal line in an inter-level dielectric (ILD); and forming a recessed opening by wet etching the cobalt metal line to below a top surface of the ILD, wherein wet etching comprises applying water to selectively remove a least a portion of the cobalt from the cobalt layer, wherein the water is at a pH of 4 to 10, a temperature from of 25 to 100° C., and is free of added buffer, acid, and/or base other than absorbed gases from an ambient environment.

In another embodiment, a method of forming a semiconductor structure includes forming a gate stack comprising a cobalt metal layer; forming sidewall spacers thereon, wherein a height of the cobalt metal layer is equal to a height of the sidewall spacers thereon; wet etching at least a portion of the cobalt metal layer to form a recess relative to the sidewall spacers thereon, wherein wet etching comprises applying water to selectively remove a least a portion of the cobalt from the cobalt layer, wherein the water is at a pH of 4 to 10, a temperature of 25 to 100° C., and is free of added buffer, acid, and/or base other than absorbed gases from an ambient environment.

The disclosure may be understood more readily by reference to the following detailed description of the various features of the disclosure and the examples included therein.

BRIEF DESCRIPTION OF THE DRAWINGS

Referring now to the figures wherein the like elements are numbered alike.

DETAILED DESCRIPTION

Figure 1:
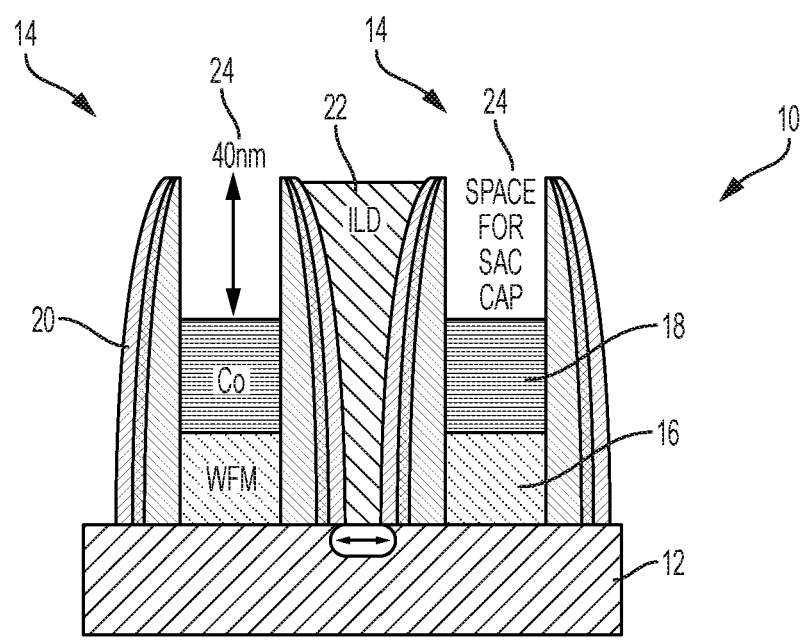
FIG. 1 ("FIG.") is a cross sectional view of a cobalt/work function material metal gate structure including a recess in the cobalt metal layer.

The present invention is generally directed to an environmentally green process for wet etching cobalt. The wet etch selective process generally includes application of water such as deionized water onto a cobalt layer, which has surprisingly been found to wet etch cobalt selective to a variety of materials commonly included in the semiconductor structure and exposed along with the cobalt layer to be etched. For example, the cobalt wet etch process is wet etch selective to metals such as titanium, titanium nitride, copper, tungsten, tantalum, tantalum nitride, ruthenium, and the like. In addition, the process is wet etch selective to dielectrics such as tetraethyl orthosilicates, silicon nitride, and ultra-low k dielectric materials (materials having K values close to or less than 3, e.g., silicon carbide derivatives, porous SiCOH, and the like), Cu, W, TiN, Ti, Ta, TaN, and SiON. The use of water at an elevated temperature overcomes many of the problems associated with prior art dry etch processes and wet etch processes that used highly corrosive materials.

The wet etch process generally includes exposing the cobalt metal to the water at an elevated temperature and for a period of time effective to remove a desired amount of the cobalt layer for the particular application. The cobalt metal may be wet etched with the water by immersion, puddle development, single nozzle dispensers or the like, at the desired elevated temperature. In one or more embodiments, the elevated temperature is in a range from 25 to 100° C. In other embodiments, the elevated temperature is in a range from 50 to 100° C.; and in still other embodiments, the temperature is about 60 to 80° C. The time is not intended to be limited and is generally less than 30 minutes in one or more embodiments, less than 10 minutes in other embodiments, and less than 3 minutes in still other embodiments.

The elevated temperature of the water should be selected to provide an etch rate of greater than 10 Angstroms per minute in most embodiments, greater than 25 Angstroms per minute in other embodiments, and greater than 50 Angstroms per minute.

In one or more embodiments, the water is deionized water. Deionized water can be formed by standard ion exchange and/or distillation techniques, as are known to one of skill in the art. A suitable deionized water used in the production of integrated circuit components typically exhibits a conductivity ranging from about 12 to 18 megaohms and is suitable for use in the wet etch process.

In one or more embodiments, the pH of the water may be between 4 and 10 and is free of any added buffers, acids, and/or bases, wherein the pH can vary within these values based on the ambient environmental conditions. It is generally known in the art that water such as deionized water can readily absorb gases in the environment that can affect pH. For example, carbon dioxide ($CO_2$) in the atmosphere is readily absorbed and dissolved in deionized water to form carbonic acid, which can lower the pH significantly to about 4.5 given that the deionized water contains no buffer. As such, the term "added buffers, acids, and/or bases" such as, for example, e.g., HCl, $H_3NO_4$, $H_2SO_4$, KOH, NaOH generally refers to materials deliberately added in defined quantities directly to the deionized water to produce a desired effect on pH as opposed to gases that may be present in the ambient atmosphere of the semiconductor manufacturing facility that are absorbed by the deionized water. In one or more embodiments, the water is maintained in a container sealed from the environment so as to minimize absorption of gases and the like that may affect pH. In other embodiments, the pH is about 5.5 to about 9 and in still other embodiments, the pH is about 6 to 7. Again, the water is free of any added buffers, acids, and/or bases.

The etch rates for removal of cobalt using water are generally greater than about 5 Å/minute to less than 100 Å/minute. By way of example, immersing the cobalt metal layer to deionized water at a temperature of about 75° C. at a pH of about 6 resulted in an etch rate of about 45 Angstroms per minute as will be described below in the examples.

The cobalt metal layer may be deposited by chemical vapor deposition (CVD), physical vapor deposition (PVD), or electroplating techniques, wherein the materials and processes for these respective deposition processes are generally known in the art. For example, CVD and PVD cobalt can be formed using a cobalt precursor as is known in the art. Suitable cobalt precursors include, but are not limited to, cobalt carbonyl complexes, cobalt amidinates compounds, cobaltocene compounds, cobalt dienyl complexes, cobalt nitrosyl complexes, derivatives thereof, complexes thereof, plasma thereof, or combinations thereof. Suitable cobalt precursors may include, but not limited to, cobalt carbonyl complexes, cobalt amidinates compounds, cobaltocene compounds, cobalt dienyl complexes, cobalt nitrosyl complexes, cobalt diazadienyl complexes, cobalt hydride complexes, derivatives thereof, complexes thereof, plasmas thereof, or combinations thereof. In one implementation, examples of the cobalt precursors that may be used herein include dicobalt hexacarbonyl butylacetylene, dicobalt hexacarbonyl methylbutylacetylene, dicobalt hexacarbonyl phenylacetylene, hexacarbonyl methylphenylacetylene, dicobalt hexacarbonyl methylacetylene, dicobalt hexacarbonyl dimethylacetylene, cobalt aminidate, cobalt hexafluoro acetylacetone, cobalt acetylacetonate, cobalt (II) acetlyacteone, cobalt acetate, derivatives thereof, complexes thereof, plasmas thereof, or combinations thereof. Other exemplary cobalt carbonyl complexes include cyclopentadienyl cobalt bis(carbonyl), tricarbonyl allyl cobalt, cobalt tricarbonyl nitrosyl, derivatives thereof, complexes thereof, plasmas thereof, or combinations thereof. In one particular example of the cobalt precursors used herein is dicobalt hexacarbonyl butylacetylene. It is noted that the precursors may be supplied into the metal deposition processing chamber with a carrier gas such as an argon gas or a reducing agent such as hydrogen (e.g., $H_2$ or atomic-H), nitrogen (e.g., $N_2$ or atomic-N), ammonia ($NH_3$), hydrazine ($N_2H_4$), a hydrogen and ammonia mixture ($H_2/NH_3$), borane ($BH_3$), diborane ($B_2H_6$), triethylborane ($Et_3B$), silane ($SiH_4$), disilane ($Si_2H_6$), trisilane ($Si_3H_8$), tetrasilane ($Si_4H_{10}$), methyl silane ($SiCH_6$), dimethylsilane ($SiC_2H_8$), phosphine ($PH_3$), derivatives thereof, plasmas thereof, or combinations thereof.

The wet etch process of cobalt metal can be integrated with the FEOL, MOL and BEOL processes currently being utilize as well as being contemplated for use in advanced technology nodes where cobalt metal is utilized and partial or complete removal is desired. Examples include, but are not limited to, metal conducting layers such as metal contact fill, metal gate fill, interconnect fill, or the like.

The present invention shall now be generally described with reference to these examples as shown in FIGS. 1-4. With the description as provided below, it is readily apparent to one skilled in the art that the various processes described with respect to the figures may be utilized in various configurations and for various applications.

In FIG. 1, there is shown an exemplary cobalt gate metal fill structure that includes a cobalt/work function material metal gate structure 10 including a recess formed in the cobalt metal layer. The recessed portion formed in the cobalt gate stack provides for subsequent formation of a self-aligned contact to the gate and reduces the chances for an electrical short between a later formed contact on source/drain epi and gate. If the gate is at its full height, then there are more chances for an electrical short between contact on source/drain and gate. Prior to formation of the self-aligned contact, the recess may be filled with a sacrificial cap material (for example, silicon nitride) to protect the gate structure.

The metal gate structure 10 is generally formed on a substrate 12, which may include a plurality of fins (not shown). The substrate 12 as shown includes a plurality of gate structures 14. The gate structures 14 can include cobalt metal as the conductor, which may be formed in two parts, e.g., by conformally depositing a working function material (WFM) 16 followed by deposition of the cobalt metal 18 thereon. The spacers 20 may be formed on both sidewalls of the gate structure 14 and may be formed of silicon oxide, silicon nitride, silicon oxynitride, silicon carbide, fluoride-doped silicate glass (FSG), a low k dielectric material, combinations thereof, and/or other suitable material. The spacers 20 may have a multiple layer structure as shown, for example, including one or more liner layers such as liner layer. By way of example, the liner layer may include a dielectric material such as silicon oxide, silicon nitride, and/or other suitable materials. The spacers 20 may be formed by methods generally known in the art including deposition of suitable dielectric material and anisotropically etching the material to form the desired spacer profile. The structure may further include an interlayer dielectric (ILD) layer 22 between gates 14 and the substrate subjected to a polishing step.

A recess 24 is then formed in the gate structure 14 by selectively removing an upper portion of the cobalt metal.

The selective removal may be carried out by the wet etch process in accordance with the present disclosure, which is selective to the spacer material(s) 20, ILD layer 22, liner materials, if present, and any other exposed materials.

As used herein, the term "work function" is a material property, measured in electron volts (eV), which represents the amount of energy needed to remove an electron from a solid to a point outside the solid surface or the energy needed to move an electron from the Fermi level into a vacuum. In practice, the work function value is the amount of energy needed to move the metal electron from the metal to the high-k material. It is believed that the value is close to the ideal work function and may sometimes vary due to the structure of the metal that gets deposited on the dielectric material. For a metal, the work function is a constant, and for a semiconductor material, the work function can be modified by the addition of other materials, such as boron or phosphorus, generally considered dopant materials. A transistor's threshold voltage may be modified when using materials having different desired work functions in a metal gate electrode structure.

The work function material may be a metal, metal carbide, metal silicide, metal carbide silicide, metal carbide nitride, or metal boride material described herein and deposited by the processes described herein. Additionally, the metal, metal carbide, metal silicide, metal carbide silicide, metal carbide nitride, or metal boride materials may contain other conductive materials, such as aluminum. Suitable work function materials include a material selected from the group of tantalum, hafnium, titanium, lanthanum, tantalum carbide, hafnium carbide, titanium carbide, lanthanum carbide, hafnium silicides, tantalum silicides, titanium silicides, lanthanum silicides, tantalum carbide silicide, hafnium carbide silicide, titanium carbide silicide, lanthanum carbide silicide, hafnium aluminide carbide, tantalum aluminide carbide, lanthanum aluminide carbide, tantalum carbide nitride, tantalum aluminide nitride, lanthanum boride, hafnium boride, or combinations thereof.

Figure 2:
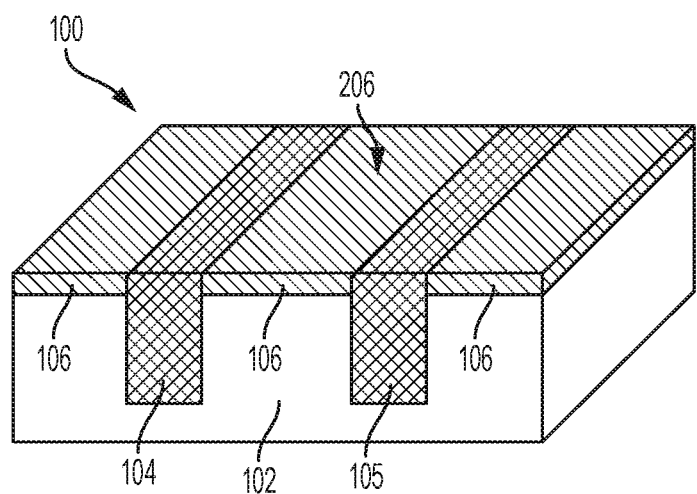
FIG. 2 is an isometric view of a semiconductor structure according to an exemplary embodiment.
Figure 3:
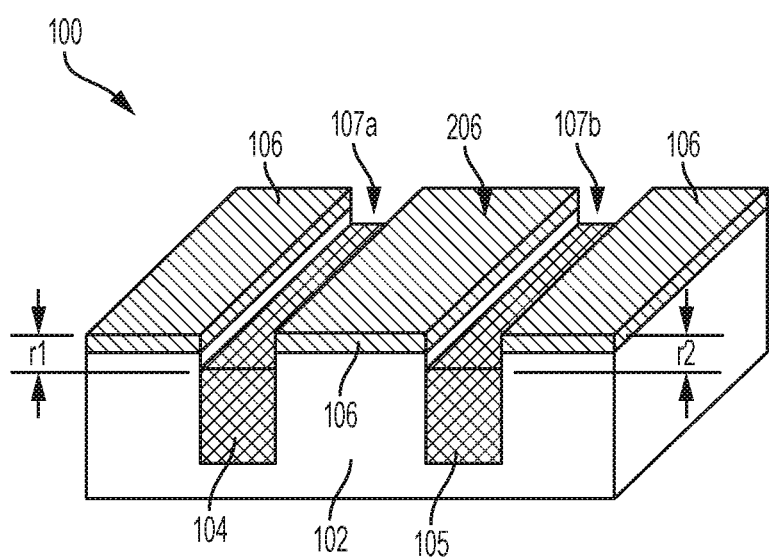
FIG. 3 illustrates a recessed metal line according to an exemplary embodiment.

In the fabrication of a metal line interconnect (via) fully aligned to both a Mx level and a Mx+1 level, the cobalt metal layer, similar to the gate structure discussed above, will typically be recessed during the manufacturing process. FIGS. 2-4 illustrate the process steps including formation of the recess, wherein the wet etch process of the present disclosure can be utilized to form the recess.

More specifically, the method can start with fabricating a first cobalt metal line 104 and a second cobalt metal line 105 in a first ILD 102.

The first ILD 102 may include any materials known in the art, such as, for example, porous silicates, carbon doped oxides, silicon dioxides, silicon nitrides, silicon oxynitrides, porous SiCOH, or other dielectric materials. The first ILD 102 may be formed using any method known in the art, such as, for example, chemical vapor deposition; plasma enhanced chemical vapor deposition, atomic layer deposition, or physical vapor deposition. The first ILD 102 may have a thickness ranging from about 25 nm to about 200 nm.

A trench stop hardmask 106 may include any masking material known in the art, such as, for example, a titanium nitride, titanium oxide, TEOS, silicon nitride low-k silicon carbide (SiC) or silicon carbonitride (SiCN). The trench stop hardmask 106 may be formed on the first ILD 102 and may be formed using any method known in the art, such as, for example, chemical vapor deposition, plasma enhanced chemical vapor deposition, atomic layer deposition, or physical vapor deposition. The trench stop hardmask 106 may have a thickness ranging from about 1 nm to 50 nm.

Metal openings may be formed in the trench stop hardmask 106 and in the first ILD 102 using any technique known in the art, such as, for example, wet or dry etching. The trench stop hardmask 106 may have a trench stop hardmask surface 206, and the trench stop hardmask surface 206 may be a top surface of the trench stop hardmask 106.

The first and second cobalt metal lines 104, 105 (associated with Mx layer) may be formed in the metal openings. The first and second cobalt metal lines 104, 105 may be fabricated using any technique known in the art, such as, for example, a single or dual damascene technique. In an embodiment, not illustrated, the first and second metal lines 104, 105 may include a metal liner, where the metal liner may be metals, such as, for example, tantalum nitride and tantalum (TaN/Ta), titanium, titanium nitride, cobalt, ruthenium, and manganese.

FIG. 3 is a demonstrative illustration of a structure 100 during an intermediate step of a method of fabricating a fully aligned via according to the first embodiment. More specifically, the method may include forming a first recessed opening 107a and a second recessed opening 107b above the first and second cobalt metal lines 104, 105.

The first and second recessed openings 107a, 107b may be formed by etching the first and second cobalt metal lines 104, 105 using the wet etch process in accordance with the present disclosure.

The first recessed opening 107a may be formed at the same time as the second recessed opening 107b. The first and second recessed openings 107a, 107b may be formed by etching the first and second metal lines 104, 105 selective to the trench stop hardmask 106 and ILD 102, where the first and second cobalt metal lines 104, 105 may be wet etched. The first and second recessed openings 107a, 107b may be formed with a first and second recessed depth (r1, r2), respectively. The first recessed depth (r1) may be the same as the second depth (r2). The first and second depth (r1, r2) may range from about 5 nm to 50 nm. The first and second recessed depth (r1, r2) may be a distance from the trench stop hardmask surface 106 to a top surface of the first and second metal lines 104, 105, respectively.

Once the cobalt metal layers 104, 105 are recessed, the method may further include forming a cap 108 on the structure 100.

Figure 4A:
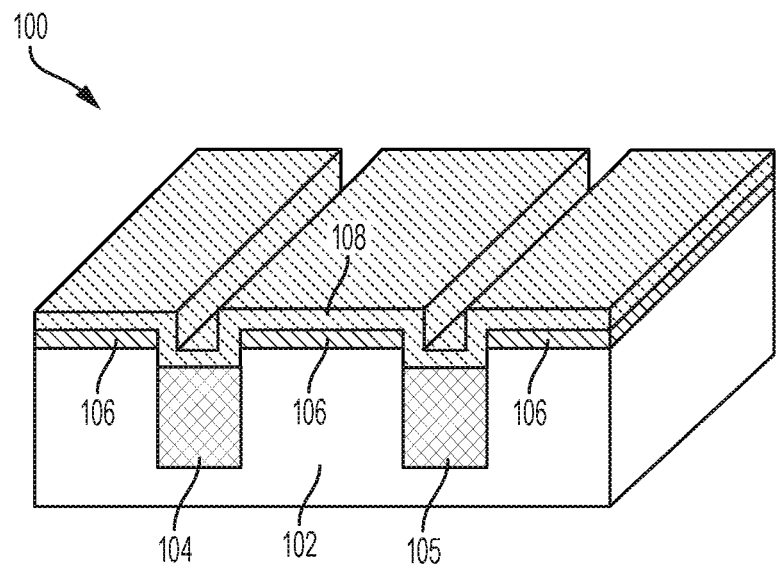
FIG. 4A illustrates an isometric view of a metal line interconnect (via) fully aligned to both a Mx level and a Mx+1 level including a cap layer in accordance with an exemplary embodiment.

In the present embodiment, illustrated as FIG. 4A, the cap 108 may be conformally deposited directly on top of the trench stop hardmask 106 and directly on top of the first and second cobalt metal lines 104, 105. The cap 108 may include any suitable dielectric material, such as, for example, silicon nitride ($Si_3N_4$), silicon carbide (SiC), silicon carbonitride (SiCN), hydrogenated silicon carbide (SiCH), or any other material known in the art. The cap 108 may be formed using any technique known in the art, such as, for example, chemical vapor deposition; plasma enhanced chemical vapor deposition, atomic layer deposition, or physical vapor deposition. The cap 108 may have a thickness ranging from about 10 nm to about 55 nm. The cap 108 may act as an air or metal diffusion barrier or insulator and may be used to improve interconnect reliability.

Figure 4B:
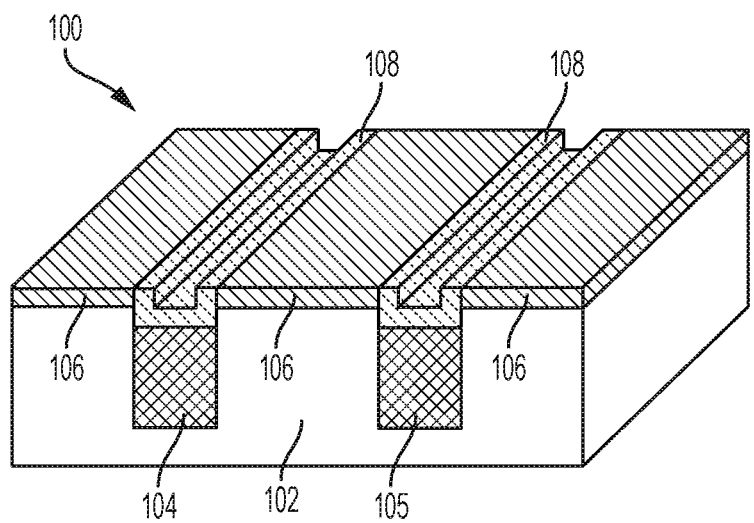
FIG. 4B illustrates an isometric view of a metal line interconnect (via) fully aligned to both a Mx level and a Mx+1 level including a cap layer in accordance with an exemplary embodiment.

In another embodiment, illustrated as FIG. 4B, the cap 108 may be polished such that the cap 108 is removed from portions above the trench stop hardmask 106 but remains above the first and second cobalt metal lines 104, 105.

Figure 4C:
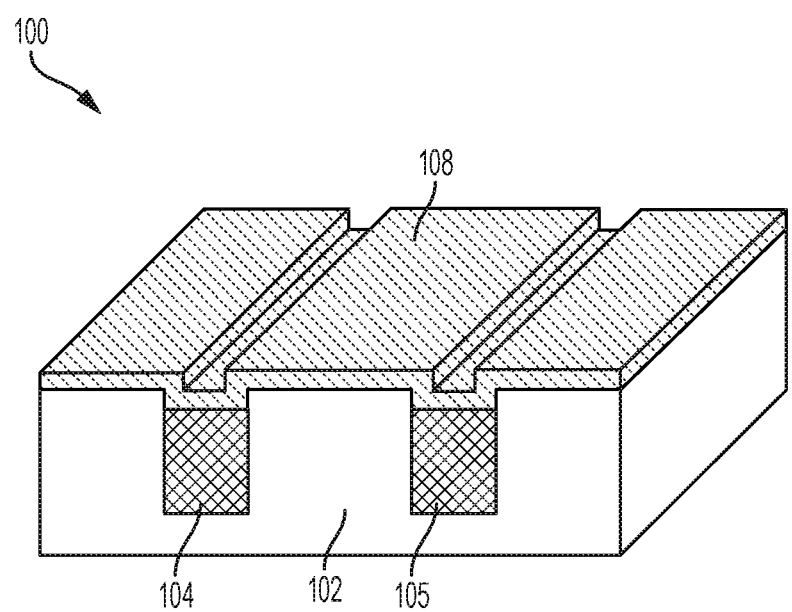
FIG. 4C illustrates an isometric view of a metal line interconnect (via) fully aligned to both a Mx level and a Mx+1 level including a cap layer in accordance with an exemplary embodiment.

In yet another embodiment, illustrated as FIG. 4C, the trench stop hardmask 106 may not be used and the cap 108 may be deposited directly on the first ILD 102.

Additional processing steps to form the metal line interconnect (via) fully aligned to both a Mx level and a Mx+1 level can be found in U.S. Pat. No. 9,324,650, which is incorporated by reference in its entirety.

In some embodiments during the manufacture of a semiconductor device, the cobalt metal layer may be subjected to plasma treatment prior to removal by the wet etch process of the present disclosure. Plasma treatment may use chlorine or fluorine based gases, such as $NF_3$, $CF_4$, and $CCl_4$ to remove portions of the exposed, i.e., unmasked, layers. Because cobalt fluorides and chlorides are nonvolatile, the dry etch process stops at the cobalt layer 26. Therefore, the cobalt layer 26 generally functions as a dry etch stop.

The processes described above are particularly useful for fabrication of DRAM word line gate electrodes and SRAM local interconnect applications. However, it should be readily apparent to one skilled in the art that the processes described above can be used for various other applications. Therefore, it is recognized that the following embodiments are for illustration only and not to be read as unduly limiting to the scope of the present invention.

The following examples are detailed descriptions of methods of preparation and use of the process of the present invention. The detailed preparations fall within the scope of, and serve to exemplify, the more generally described methods set forth above. The examples are presented for illustrative purposes only, and are not intended as a restriction on the scope of the invention.

Example 1

In this example, a cobalt layer was etched as a function of time.

Tetraethyl orthosilicate (TEOS) was deposited onto blanket silicon wafers at a thickness of 400 Angstroms. Titanium (Ti) was then deposited at a thickness of 75 Angstroms followed by deposition of 30 Angstroms of titanium nitride (TiN). CVD cobalt was then deposited at a thickness of 200 Angstroms to form a final stack of Si/TEOS/Ti/TiN/Co. Actual cobalt thickness was measured by X-Ray fluorescence (XRF).

Figure 5:
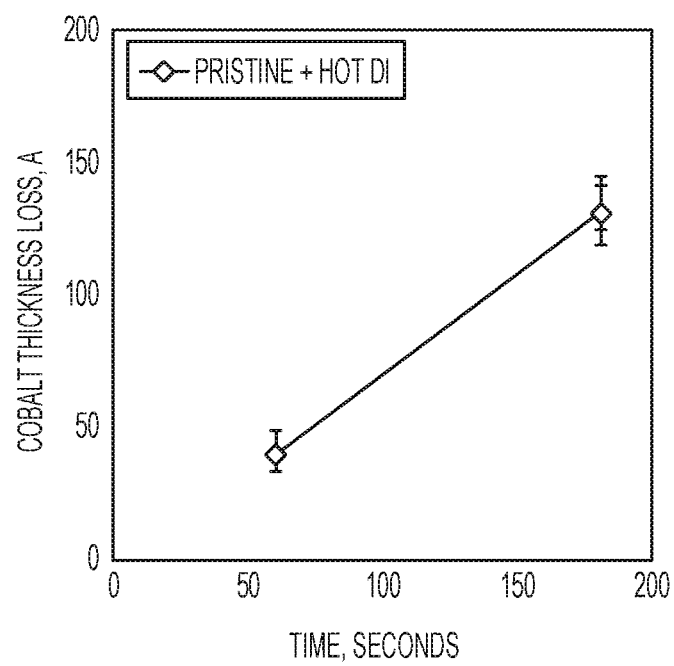
FIG. 5 graphically illustrates cobalt thickness loss as functions of time for a wet etch process in accordance with the present disclosure.

The CVD cobalt layer was the subjected to application of deionized water at a temperature of 75° C. and a pH of about 6. The application of the deionized water included spraying a stream onto a spinning wafer in a single wafer wet tool. CVD cobalt thickness was measured as a function of time using XRF and thickness loss measured as shown in FIG. 5.

As shown, the etch rate for the process was about 45 Angstroms per minute.

All ranges disclosed herein are inclusive of the endpoints, and the endpoints are combinable with each other.

All cited patents, patent applications, and other references are incorporated herein by reference in their entirety.

The use of the terms "a" and "an" and "the" and similar referents in the context of describing the invention (especially in the context of the following claims) are to be construed to cover both the singular and the plural, unless otherwise indicated herein or clearly contradicted by context. Further, it should further be noted that the terms "first," "second," and the like herein do not denote any order, quantity, or importance, but rather are used to distinguish one element from another.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A method of selectively etching a cobalt layer, comprising:
   applying water to selectively remove at least a portion of the cobalt from the cobalt layer, wherein the water is at a pH of 4 to 10 at an elevated temperature in a range from 25° C. to 100° C. and is free of added buffer, acid, and/or base other than absorbed gases from an ambient environment.

2. The method of claim 1, wherein applying the water is at temperature from 60° C. to 85° C.

3. The method of claim 1, wherein applying the water is at 75° C.

4. The method of claim 1, wherein the pH is from 5.5 to 9.

5. The method of claim 1, further comprising exposing the cobalt metal layer to a plasma treatment prior to applying the water.

6. The method of claim 1, wherein the pH is from 6 to 7.

7. The method of claim 1, wherein the water is deionized water.

8. The method of claim 1, wherein the cobalt layer is CVD deposited.

9. The method of claim 1, wherein the cobalt layer is PVD deposited.

10. The method of claim 1, wherein the cobalt layer is electroplated.

11. A method of forming a semiconductor structure comprising:
    forming a cobalt metal line in an inter-level dielectric (ILD); and
    forming a recessed opening by wet etching the cobalt metal line to below a top surface of the ILD, wherein wet etching comprises applying water to selectively remove a least a portion of the cobalt from the cobalt layer, wherein the water is at a pH of 4 to 10, a temperature from of 25 to 100° C., and is free of added buffer, acid, and/or base other than absorbed gases from an ambient environment.

12. The method of claim 11, further comprising forming a cap on the ILD and in the recessed opening.

13. The method of claim 11, wherein the temperature is from 60° C. to 85° C.

14. The method of claim 11, wherein the temperature is 75° C.

15. The method of claim 11, wherein the pH is in a range from 5.5 to 8.

16. A method of forming a semiconductor structure comprising:
    forming a gate stack comprising a cobalt metal layer;
    forming sidewall spacers thereon, wherein a height of the cobalt metal layer is equal to a height of the sidewall spacers thereon;
    wet etching at least a portion of the cobalt metal layer to form a recess relative to the sidewall spacers thereon, wherein wet etching comprises applying water to selectively remove a least a portion of the cobalt from the cobalt layer, wherein the water is at a pH of 4 to 10, a temperature of 25 to 100° C., and is free of added buffer, acid, and/or base other than absorbed gases from an ambient environment.

17. The method of claim 16, wherein the temperature is from 60° C. to 85° C.

18. The method of claim 16, wherein the elevated temperature is 75° C.

19. The method of claim 16, wherein the pH is in a range from 5.5 to 9.

* * * * *